United States Patent
Monden et al.

(10) Patent No.: US 11,970,767 B2
(45) Date of Patent: Apr. 30, 2024

(54) FILM FORMING METHOD AND FILM FORMING APPARATUS

(71) Applicant: Tokyo Electron Limited, Tokyo (JP)

(72) Inventors: Taichi Monden, Nirasaki (JP); Tetsu Zenko, Nirasaki (JP); Kazuki Ota, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/989,267

(22) Filed: Aug. 10, 2020

(65) Prior Publication Data

US 2021/0047727 A1 Feb. 18, 2021

(30) Foreign Application Priority Data

Aug. 15, 2019 (JP) .................. 2019-149133

(51) Int. Cl.
| | |
|---|---|
| *C23C 16/34* | (2006.01) |
| *C23C 16/44* | (2006.01) |
| *C23C 16/455* | (2006.01) |
| *C23C 16/458* | (2006.01) |

(52) U.S. Cl.
CPC ........ *C23C 16/345* (2013.01); *C23C 16/4412* (2013.01); *C23C 16/45553* (2013.01); *C23C 16/45565* (2013.01); *C23C 16/4583* (2013.01)

(58) Field of Classification Search
None
See application file for complete search history.

(56) References Cited

U.S. PATENT DOCUMENTS

| | | | |
|---|---|---|---|
| 2004/0009336 A1* | 1/2004 | Marcadal | H01L 21/28562 428/210 |
| 2005/0045092 A1* | 3/2005 | Wu | H01L 21/02181 117/103 |
| 2015/0050806 A1* | 2/2015 | Park | C23C 16/45529 438/643 |

FOREIGN PATENT DOCUMENTS

| | | |
|---|---|---|
| JP | 2005-512337 A | 4/2005 |
| JP | 2013-145796 A | 7/2013 |
| WO | 2018222920 A1 | 12/2018 |

* cited by examiner

*Primary Examiner* — Michael G Miller

(74) *Attorney, Agent, or Firm* — Nath, Goldberg & Meyer; Jerald L. Meyer; Tanya E. Harkins

(57) ABSTRACT

A method of forming a metal-containing nitride film containing silicon includes: supplying a metal-containing gas into a processing container in which a substrate is accommodated; supplying a silicon-containing gas into the processing container; and supplying a nitrogen-containing gas into the processing container, wherein a series of processes, in which the supplying the metal-containing gas and the supplying the silicon-containing gas are executed n times in this order (where n is an integer of one or more) and then the supplying the nitrogen-containing gas is executed, is repeated m times in this order (where m is an integer of one or more).

10 Claims, 4 Drawing Sheets

△ Comparative example
○ Present embodiment (one cycle)
● Present embodiment (multiple cycles)

○ Present embodiment (one cycle)
● Present embodiment (multiple cycles)

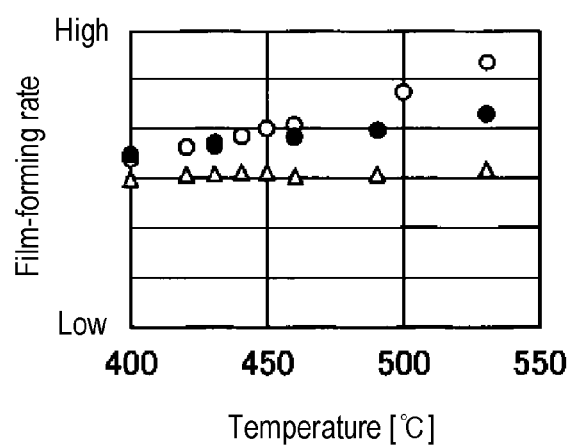

FILM FORMING METHOD AND FILM FORMING APPARATUS

CROSS-REFERENCE TO RELATED APPLICATION(S)

This application is based upon and claims the benefit of priority from Japanese Patent Application No. 2019-149133, filed on Aug. 15, 2019, the entire contents of which are incorporated herein by reference.

TECHNICAL FIELD

The present disclosure relates to a film forming method and a film forming apparatus.

BACKGROUND

For example, Patent Document 1 proposes a method of forming a metal silicon nitride layer having a high melting point on a substrate by using a metal-containing gas, a silicon-containing gas, and a nitrogen-containing gas.

For example, Patent Document 2 proposes a method of forming a TiSiN film on a substrate by using a titanium-containing gas, a silicon-containing gas, and a nitrogen-containing gas.

PRIOR ART DOCUMENTS

Patent Documents

Patent Document 1: Japanese laid-open publication No. 2005-512337
Patent Document 2: Japanese laid-open publication No. 2013-145796

SUMMARY

According to an aspect of the present disclosure, a method of forming a metal-containing nitride film containing silicon includes: supplying a metal-containing gas into a processing container in which a substrate is accommodated; supplying a silicon-containing gas into the processing container; and supplying a nitrogen-containing gas into the processing container, wherein a series of processes, in which the supplying the metal-containing gas and the supplying the silicon-containing gas are executed n times in this order (where n is an integer of one or more) and then the supplying the nitrogen-containing gas is executed, is repeated m times in this order (where m is an integer of one or more).

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a view showing an example of film-forming rates obtained by a film forming method according to an embodiment.

DETAILED DESCRIPTION

Figure 1:
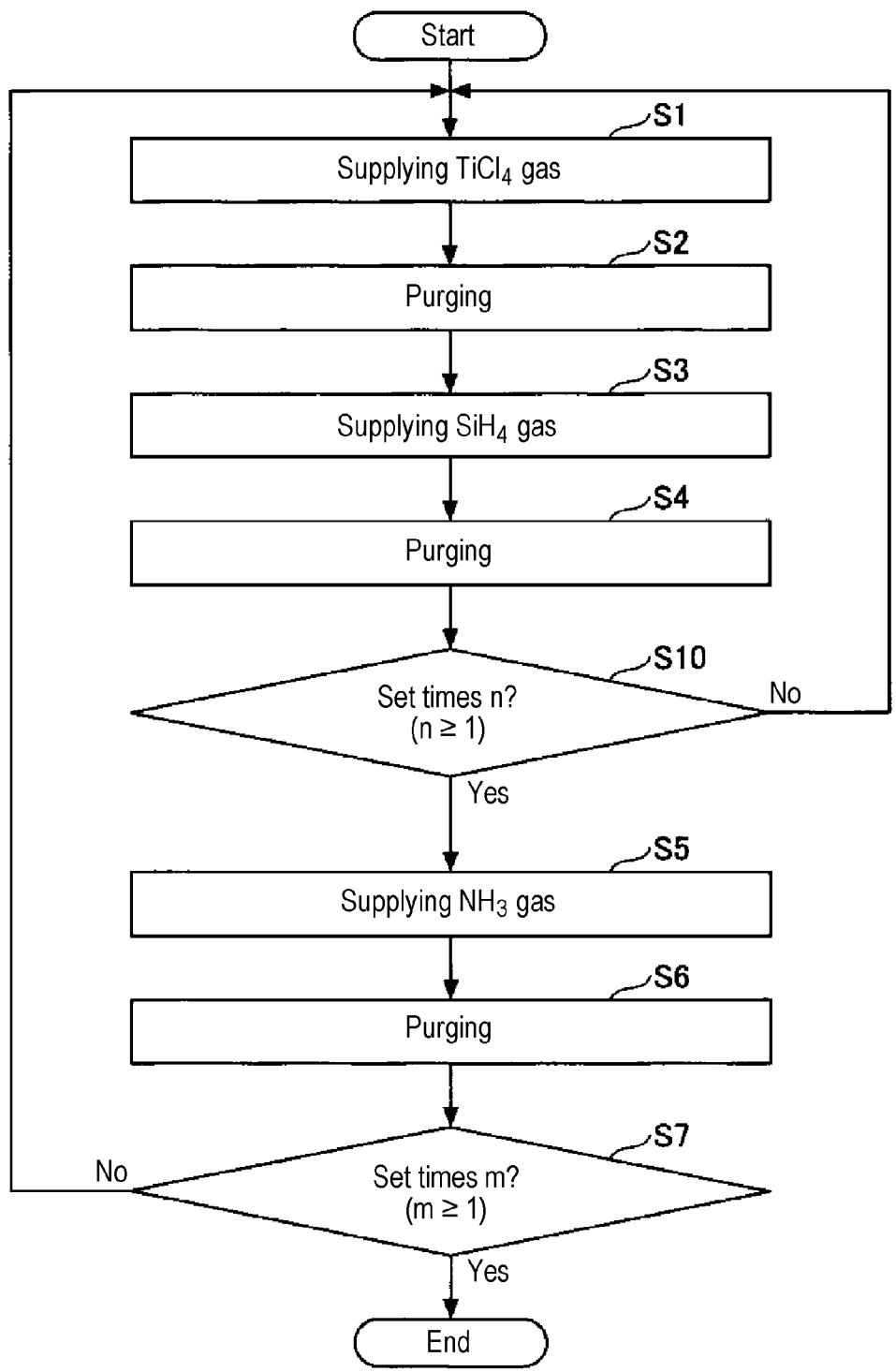
FIG. 1 is a flowchart illustrating a method of forming a TiSiN film according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

A film forming method according to an embodiment is a method for forming a metal-containing nitride film containing (doped with) silicon on a substrate through an atomic layer deposition (ALD) method. In the following description, a titanium silicon nitride (TiSiN) film is formed as an example of a doped metal-containing nitride film.

Specifically, a film forming method according to an embodiment includes a process of supplying a metal-containing gas into a processing container accommodating a substrate, a process of supplying a silicon-containing gas into the processing container, and a process of supplying a nitrogen-containing gas into the processing container, wherein a series of processes, in which the processes of supplying the metal-containing gas and supplying the silicon-containing gas is executed n times (n is an integer of one or more) in this order and then the process of supplying the nitrogen-containing gas is executed, is repeated m times (m is an integer of one or more) in this order.

Hereafter, the process of supplying the metal-containing gas into the processing container is referred to as a "first process." As an example of the "first process," a process of supplying a titanium tetrachloride ($TiCl_4$) gas into the processing container will be described.

In addition, the process of supplying the silicon-containing gas into the processing container will be referred to as a "second process." As an example of the "second process," a process of supplying a silane ($SiH_4$) gas into the processing container will be described.

In addition, the process of supplying the nitrogen-containing gas into the processing container will be referred to as a "third process." As an example of the "third process," a process of supplying an ammonia ($NH_3$) gas into the processing container will be described.

In the film forming method according to the present embodiment, a series of processes, in which the first process and the second process are executed once or multiple times (n times) in this order and then the third process is executed, is repeated multiple times (m times) in this order. Hereinafter, the film forming method when n is "1" may be referred to as a "present embodiment (one cycle)", and the film forming method when n is a "multiple" may be referred to as a "present embodiment (multiple cycles)".

[Film Forming Method]

A method of forming a TiSiN film according to an embodiment is described with reference to FIG. 1. FIG. 1 is a flowchart illustrating a method of forming a TiSiN film according to an embodiment.

First, a substrate is accommodated in a processing container, the interior of the processing container is maintained in a reduced pressure state, and a temperature of the substrate is adjusted to a predetermined temperature. Subsequently, a $TiCl_4$ gas is supplied into the processing container in which the substrate is accommodated (step S1). Accordingly, Ti is deposited on the substrate to form a Ti layer. The processing time of step S1 may be, for example, 0.01 sec to 5 sec. The $TiCl_4$ gas is an example of the metal-containing gas. As the metal-containing gas, a $TiCl_4$ gas, a tetrakis dimethylamido titanium (TDMAT) gas, a tetrakis ethylmethylamido titanium (TEMAT) gas, a tetrakis diethylamido titanium (TDEAT) gas, or the like may be used.

Subsequently, after stopping the supply of the $TiCl_4$ gas, the interior of the processing container is purged with a purge gas (step S2). As the purge gas, an inert gas such as a $N_2$ gas or an Ar gas may be used. In an embodiment, the purge gas is $N_2$ gas and the processing time of step S2 is 0.01 sec to 5 sec.

Subsequently, after stopping the supply of the purge gas, a $SiH_4$ gas is supplied into the processing container (step S3). As a result, Si is doped into the Ti layer formed on the substrate. The processing time of step S3 may be, for example, 0.05 sec to 5 sec. In some embodiments, the processing time of step S3 may be the same as the processing time of step S1. The $SiH_4$ gas is an example of the silicon-containing gas. As the silicon-containing gas, a $SiH_4$ gas, a $Si_2H_6$ gas, a $ClH_3Si$ gas, a $SiH_2Cl_2$ (DCS) gas, or the like may be used.

Subsequently, after stopping the supply of the $SiH_4$ gas, the interior of the processing container is purged with a purge gas (step S4). As the purge gas, an inert gas such as a $N_2$ gas or an Ar gas may be used. In an embodiment, the purge gas is $N_2$ gas, and the processing time is 0.01 sec to 5 sec.

Subsequently, it is determined whether or not the number of executing a film-forming cycle of steps S1 to S4 has reached a preset number of n times (n is an integer of one or more) (step S10). In step S10, when the number of executing the film-forming cycle has not reached the set number n, the process returns to step S1, and the processing of steps S1 to S4 is executed again. By repeating the cycle of forming a Ti film doped with Si until the set number of times n is reached, the $TiCl_4$ gas and the $SiH_4$ gas can sufficiently react with each other. In step S10, when the number of executing the film-forming cycle has reached the set number n, the process proceeds to step S5.

Subsequently, a $NH_3$ gas is supplied into the processing container (step S5). As a result, the TiSi layer (i.e., the Ti film doped with Si) formed on the substrate is nitrided to form a TiSiN film. The processing time of step S5 is 0.01 sec to 5 sec. The $NH_3$ gas is an example of the nitrogen-containing gas. As the nitrogen-containing gas, a $NH_3$ gas, a $N_2H_4$ gas, an MMH gas, or the like may be used.

Subsequently, after stopping the supply of the $NH_3$ gas, the interior of the processing container is purged with a purge gas (step S6). As the purge gas, an inert gas such as a $N_2$ gas or an Ar gas may be used. In an embodiment, the purge gas is a $N_2$ gas, and the processing time of step S6 is 0.01 sec to 5 sec.

Subsequently, it is determined whether or not the number of executing the film-forming cycle of steps S1 to S4, S10, S5, and S6 has reached a preset number of m times (m is an integer of one or more) (step S7). In step S7, when the number of executing the film-forming cycle has not reached the set number m, the process returns to step S1, and the processing of steps S1 to S4, S10, S5, and S6 is executed again. By repeating the cycle of forming the TiSiN film until the preset number of times m is reached, a Si-doped TiSiN film having desired film characteristics is formed on the substrate. In step S7, when the number of executing the film-forming cycle has reached the set number m, the processing is terminated. In this film forming method, the processing time of each step may be the same in some embodiments.

(Film Forming Apparatus)

Figure 2:
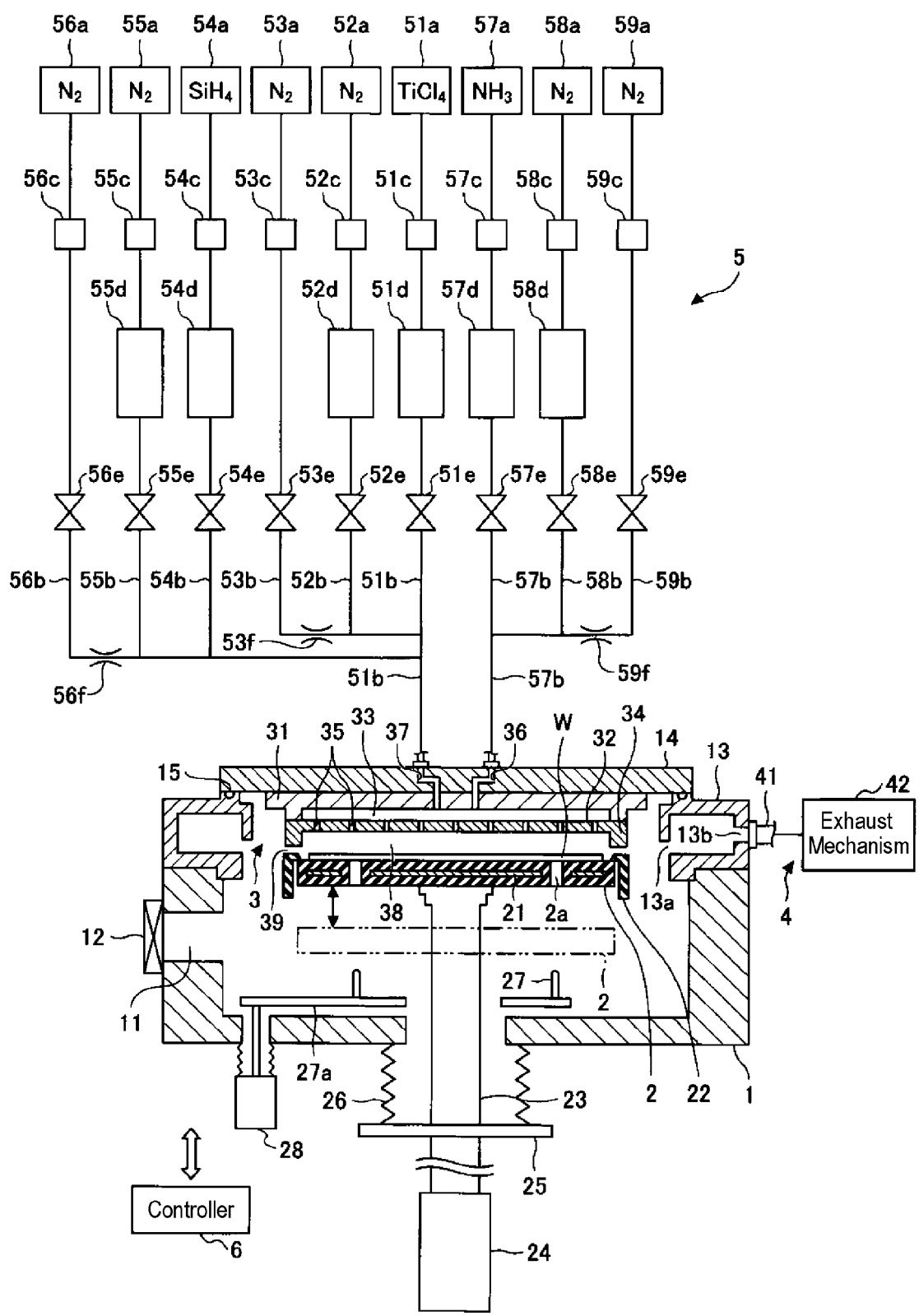
FIG. 2 is a view illustrating an example of a film forming apparatus according to an embodiment.

An example of a film forming apparatus that realizes a method of forming a TiSiN film, which is an example of a metal-containing nitride film containing (doped with) silicon, will be described. FIG. 2 is a schematic view illustrating an example of a configuration of a film forming apparatus. The film forming apparatus has a processing container 1, a stage 2, a shower head 3, an exhauster 4, a gas supply mechanism 5, and a controller 6.

The processing container 1 is formed of a metal such as aluminum, and has a substantially cylindrical shape. A wafer W as a substrate to be processed is accommodated in the processing container 1. A loading and unloading port 11 through which the wafer is loaded and unloaded is formed in a side wall of the processing container 1, and is opened and closed by a gate valve 12. An annular exhaust duct 13 having a rectangular cross section is provided on a main body of the processing container 1. The exhaust duct 13 has a slit 13a formed along an inner peripheral surface of the exhaust duct 13. An exhaust port 13b is formed in an outer wall of the exhaust duct 13. On a top surface of the exhaust duct 13, a ceiling wall 14 is provided to close an upper opening of the processing container 1. A space between the exhaust duct 13 and the ceiling wall 14 is hermetically sealed with a seal ring 15.

The stage 2 horizontally supports the wafer W in the processing container 1. The stage 2 is formed in a disk shape having a size corresponding to the wafer W. The stage 2 is formed of a ceramic material such as aluminum nitride (AlN), or a metal material such as aluminum or a nickel alloy. A heater 21 for heating the wafer W is embedded in the stage 2. The heater 21 is supplied with an electric power from a heater power supply (not illustrated) to generate heat. In addition, an output of the heater 21 is controlled by a temperature signal of a thermocouple (not illustrated) provided in the vicinity of a top surface of the stage 2, whereby a temperature of the wafer W is controlled. The stage 2 is provided with a cover 22 formed of ceramic such as alumina, which covers an outer peripheral region of the top and side surfaces of the stage 2.

A support 23 is provided on a bottom surface of the stage 2 to support the stage 2. The support 23 extends from the center of the bottom surface of the stage 2 to below the processing container 1 through a hole formed in a bottom wall of the processing container 1, and the lower end of the support 23 is connected to a lifting mechanism 24. The stage 2 moves up and down by the lifting mechanism 24 via the support 23, between a processing position illustrated in FIG. 2 and a transfer position indicated by the two-dot chain line below the processing position where the wafer W is capable of being transferred. A flange 25 is attached to a portion of the support 23 below the processing container 1. A bellows 26, which partitions an atmosphere in the processing container 1 from the external air, is provided between the bottom surface of the processing container 1 and the flange 25 to expand and contract in response to the upward and downward movement of the stage 2.

Three wafer support pins 27 (only two of which are illustrated) are provided in the vicinity of the bottom surface of the processing container 1 to protrude upward from a lifting plate 27a. The wafer support pins 27 move up and down by a lifting mechanism 28 provided below the processing container 1 via the lifting plate 27a. The wafer support pins 27 are inserted through through-holes 2a formed in the stage 2 located at the transfer position, and are configured to protrude and retract with respect to the top surface of the stage 2. By moving the wafer support pins 27 up and down, the wafer W is delivered between a transfer mechanism (not illustrated) and the stage 2.

The shower head 3 supplies a processing gas into the processing container 1 in the form of a shower. The shower head 3 is formed of a metal and is provided to face the stage 2. The shower head 3 has a diameter substantially equal to that of the stage 2. The shower head 3 has a plate support 31 fixed to the ceiling wall 14 of the processing container 1 and a shower plate 32 connected to a bottom surface of the plate support 31. A gas diffusion space 33 is formed between the plate support 31 and the shower plate 32. In the gas diffusion space 33, gas introduction holes 36 and 37 are provided through central portions of the plate support 31 and the ceiling wall 14 of the processing container 1. An annular protrusion 34 protruding downward is formed on a peripheral edge portion of the shower plate 32. Gas ejection holes 35 are formed in a flat surface disposed inward than the annular protrusion 34. In a state in which the stage 2 is located at the processing position, a processing space 38 is formed between the stage 2 and the shower plate 32, and a top surface of the cover 22 and the annular protrusion 34 come close to each other to form an annular gap 39.

The exhauster 4 evacuates the interior of the processing container 1. The exhauster 4 includes an exhaust pipe 41 connected to the exhaust port 13b, and an exhaust mechanism 42 connected to the exhaust pipe 41 and having a vacuum pump, a pressure control valve, and the like. During the processing, a gas in the processing container 1 reaches the exhaust duct 13 via the slit 13a, and is exhausted from the exhaust duct 13 through the exhaust pipe 41 by the exhaust mechanism 42.

The gas supply mechanism 5 supplies the processing gas into the processing container 1. The gas supply mechanism 5 includes a Ti-containing gas source 51a, a $N_2$ gas source 52a, a $N_2$ gas source 53a, a Si-containing gas source 54a, a $N_2$ gas source 55a, a $N_2$ gas source 56a, a nitrogen-containing gas source 57a, a $N_2$ gas source 58a, and a $N_2$ gas source 59a.

The Ti-containing gas source 51a supplies a $TiCl_4$ gas, which is an example of the Ti-containing gas, into the processing container 1 through a gas supply line 51b. The gas supply line 51b is provided with a flow rate controller 51c, a storage tank 51d, and a valve 51e from the upstream side. The downstream side of the valve 51e in the gas supply line 51b is connected to the gas introduction hole 37 through the gas supply line 51b. The $TiCl_4$ gas supplied from the Ti-containing gas source 51a is temporarily stored in the storage tank 51d before being supplied into the processing container 1, and is boosted to a predetermined pressure in the storage tank 51d. Then, the $TiCl_4$ gas is supplied into the processing container 1. The supply and stopping the supply of the $TiCl_4$ gas from the storage tank 51d to the processing container 1 are performed by the valve 51e. By temporarily storing the $TiCl_4$ gas in the storage tank 51d as described above, it is possible to stably supply the $TiCl_4$ gas into the processing container 1 at a relatively large flow rate.

The $N_2$ gas source 52a supplies a $N_2$ gas, which is an example of the purge gas, into the processing container 1 through a gas supply line 52b. The gas supply line 52b is provided with a flow rate controller 52c, a storage tank 52d, and a valve 52e from the upstream side. The downstream side of the valve 52e in the gas supply line 52b is connected to the gas supply line 51b. The $N_2$ gas supplied from the $N_2$ gas source 52a is temporarily stored in the storage tank 52d before being supplied into the processing container 1, and is boosted to a predetermined pressure in the storage tank 52d. Then, the $N_2$ gas is supplied into the processing container 1. The supply and stop of the $N_2$ gas from the storage tank 52d to the processing container 1 are performed by the valve 52e. By temporarily storing the $N_2$ gas in the storage tank 52d as described above, it is possible to stably supply the $N_2$ gas into the processing container 1 at a relatively large flow rate.

The $N_2$ gas source 53a supplies $N_2$ gas, which is an example of the carrier gas, into the processing container 1 through a gas supply line 53b. The gas supply line 53b is provided with a flow rate controller 53c, a valve 53e, and an orifice 53f from the upstream side. The downstream side of the orifice 53f in the gas supply line 53b is connected to the gas supply line 51b. The $N_2$ gas supplied from the $N_2$ gas source 53a is continuously supplied into the processing container 1 during the film formation on the wafer W. The supply and stopping the supply of the $N_2$ gas from the $N_2$ gas source 53a to the processing container 1 are performed by the valve 53e. The orifice 53f suppresses the relatively large flow rates of gases supplied to the gas supply lines 51b and 52b from the storage tanks 51d and 52d, respectively, from flowing backward to the $N_2$ gas supply line 53b.

The Si-containing gas source 54a supplies a $SiH_4$ gas, which is an example of the silicon-containing gas, into the processing container 1 through a gas supply line 54b. The gas supply line 54b is provided with a flow rate controller 54c, a storage tank 54d, and a valve 54e from the upstream side. The downstream side of the valve 54e in the gas supply line 54b is connected to the gas supply line 51b through the gas supply line 54b. The $SiH_4$ gas supplied from the Si-containing gas source 54a is temporarily stored in the storage tank 54d before being supplied into the processing container 1, and is boosted to a predetermined pressure in the storage tank 54d. Then, the $SiH_4$ gas is supplied into the processing container 1. The supply and stopping the supply of the $SiH_4$ gas from the storage tank 54d to the processing container 1 are performed by the valve 54e. By temporarily storing the $SiH_4$ gas in the storage tank 54d as described above, it is possible to stably supply the $SiH_4$ gas into the processing container 1 at a relatively large flow rate.

The $N_2$ gas source 55a supplies a $N_2$ gas, which is an example of the purge gas, into the processing container 1 through a gas supply line 55b. The gas supply line 55b is provided with a flow rate controller 55c, a storage tank 55d, and a valve 55e from the upstream side. The downstream side of the valve 55e in the gas supply line 55b is connected to the gas supply line 51b through the gas supply line 55b. The $N_2$ gas supplied from the $N_2$ gas source 55a is temporarily stored in the storage tank 55d before being supplied into the processing container 1, and is boosted to a predetermined pressure in the storage tank 55d. Then, the $N_2$ gas is supplied into the processing container 1. The supply and stop of the $N_2$ gas from the storage tank 55d to the processing container 1 are performed by the valve 55e. By temporarily storing the $N_2$ gas in the storage tank 55d as described above, it is possible to stably supply the N₂ gas into the processing container 1 at a relatively large flow rate.

The N₂ gas supply source 56a supplies a N₂ gas, which is an example of the carrier gas, into the processing container 1 through a gas supply line 56b. The gas supply line 56b is provided with a flow rate controller 56c, a valve 56e, and an orifice 56f from the upstream side. The downstream side of the orifice 56f in the gas supply line 56b is connected to the gas supply line 51b. The N₂ gas supplied from the N₂ gas source 56a is continuously supplied into the processing container 1 during the film formation on the wafer W. The supply and stopping the supply of the N₂ gas from the N₂ gas source 56a to the processing container 1 are performed by the valve 56e. The orifice 56f suppresses the relatively large flow rate of gases supplied to the gas supply lines 54b and 55b from the storage tanks 54d and 55d, respectively, from flowing backward to the N₂ gas supply line 56b.

The nitrogen-containing gas source 57a supplies a NH₃ gas, which is an example of the nitrogen-containing gas, into the processing container 1 through a gas supply line 57b. The gas supply line 57b is provided with a flow rate controller 57c, a storage tank 57d, and a valve 57e from the upstream side. The downstream side of the valve 57e in the gas supply line 57b is connected to the gas introduction hole 36 through the gas supply line 57b. The NH₃ gas supplied from the nitrogen-containing gas source 57a is temporarily stored in the storage tank 57d before being supplied into the processing container 1, and is boosted to a predetermined pressure in the storage tank 57d. Then, the NH₃ gas is supplied into the processing container 1. The supply and stopping the supply of the NH₃ gas from the storage tank 57d to the processing container 1 are performed by the valve 57e. By temporarily storing the NH₃ gas in the storage tank 57d as described above, it is possible to stably supply the NH₃ gas into the processing container 1 at a relatively large flow rate.

The N₂ gas source 58a supplies a N₂ gas, which is an example of the purge gas, into the processing container 1 through a gas supply line 58b. The gas supply line 58b is provided with a flow rate controller 58c, a storage tank 58d, and a valve 58e from the upstream side. The downstream side of the valve 58e in the gas supply line 58b is connected to the gas supply line 57b through the gas supply line 58b. The N₂ gas supplied from the N₂ gas source 58a is temporarily stored in the storage tank 58d before being supplied into the processing container 1, and is boosted to a predetermined pressure in the storage tank 58d. Then, and the N₂ gas is supplied into the processing container 1. The supply and stopping the supply of the N₂ gas from the storage tank 58d to the processing container 1 are performed by the valve 58e. By temporarily storing the N₂ gas in the storage tank 58d as described above, it is possible to stably supply the N₂ gas into the processing container 1 at a relatively large flow rate.

The N₂ gas source 59a supplies a N₂ gas, which is an example of the carrier gas, into the processing container 1 through a gas supply line 59b. The gas supply line 59b is provided with a flow rate controller 59c, a valve 59e, and an orifice 59f from the upstream side. The downstream side of the orifice 59f in the gas supply line 59b is connected to a gas supply line 57b. The N₂ gas supplied from the N₂ gas source 59a is continuously supplied into the processing container 1 during the film formation on the wafer W. The supply and stopping the supply of the N₂ gas from the N₂ gas source 59a to the processing container 1 are performed by the valve 59e. The orifice 59f suppresses the relatively large flow rates of gases supplied to the gas supply lines 57b and 58b from the storage tanks 57d and 58d, respectively, from flowing backward to the N₂ gas supply line 59b.

The controller 6 is, for example, a computer, and includes, for example, a central processing unit (CPU), a random access memory (RAM), a read only memory (ROM), and an auxiliary storage device. The CPU operates based on a program stored in the ROM or the auxiliary storage device, and controls operation of the film forming apparatus. The controller 6 may be provided either inside or outside the film forming apparatus. In a case where the controller 6 is provided outside the film forming apparatus, the controller 6 is capable of controlling the film forming apparatus through a wired or wireless communication mechanism.

Next, a method of forming a TiSiN film, which is an example of the metal-containing nitride film containing (doped with) silicon, on a wafer W using the film forming apparatus of FIG. 2 will be described with reference to FIG. 1. First, in a state in which the valves 51e to 59e are closed, the gate valve 12 is opened, and a wafer W is transferred into the processing container 1 by the transfer mechanism (not illustrated) and then is placed on the stage 2 located at the transfer position.

After the transfer mechanism is retracted from the interior of the processing container 1, the gate valve 12 is closed. The wafer W is heated to a predetermined temperature (e.g., any temperature in a range of 350 degrees C. to 530 degrees C.) by the heater 21 of the stage 2, and the stage 2 is moved up to the processing position so as to form the processing space 38. In addition, the pressure control valve of the exhaust mechanism 42 adjusts the pressure inside the processing container 1 to a predetermined pressure (e.g., 400 Pa to 1200 Pa).

Subsequently, the valves 53e, 56e, and 59e are opened, and a predetermined flow rate of the carrier gas (N₂ gas) is supplied into the processing container 1 from the N₂ gas sources 53a, 56a, and 59a through the gas supply lines 53b, 56b, and 59b, respectively, and via the gas supply lines 51b and 57b. In addition, the TiCl₄ gas, the SiH₄ gas, and the NH₃ gas are supplied to the gas supply lines 51b, 54b, and 57b from the Ti-containing gas source 51a, the Si-containing gas source 54a, and the nitrogen-containing gas source 57a, respectively. At this time, since the valves 51e, 54e, and 57e are closed, the TiCl₄ gas, the SiH₄ gas, and the NH₃ gas are stored in the storage tanks 51d, 54d, and 57d, respectively, and the pressures in the storage tanks 51d, 54d, and 57d are boosted.

Subsequently, the valve 51e is opened, and the TiCl₄ gas stored in the storage tank 51d is supplied into the processing container 1 and adsorbed onto the surface of the wafer W (step S1). In addition, in parallel with the supply of the TiCl₄ gas into the processing container 1, the N₂ gas sources 52a, 55a, and 58a supply the purge gas (N₂ gas) to the gas supply lines 52b, 55b, and 58b, respectively. At this time, since the valves 52e, 55e, and 58e are closed, the purge gas is stored in the storage tanks 52d, 55d, and 58d, and the pressures inside the storage tanks 53d, 55d, and 58d are boosted.

After a predetermined processing time (e.g., 0.01 to 5 seconds) elapses after the valve 51e is opened, the valve 51e is closed and the valves 52e, 55e, and 58e are opened. Thus, the supply of the TiCl₄ gas into the processing container 1 is stopped, and the purge gas stored in each of the storage tanks 52d, 55d, and 58d is supplied into the processing container 1 (step S2). At this time, since the purge gas is supplied from the storage tanks 52d, 55d, and 58d in the pressure-boosted state, the purge gas is supplied into the processing container 1 at a relatively large flow rate (e.g., a flow rate larger than the flow rate of the carrier gas). Therefore, the TiCl₄ gas remaining in the processing container 1 is quickly discharged to the exhaust pipe 41, and the interior of the processing container 1 is replaced from a TiCl$_4$ gas atmosphere to a N$_2$ gas atmosphere in a short time. In addition, by closing the valve 51e, the TiCl$_4$ gas supplied from the Ti-containing gas source 51a to the gas supply line 51b is stored in the storage tank 51d, and the pressure inside the storage tank 51d is boosted.

After a predetermined processing time (e.g., 0.01 to 5 seconds) elapses after the valves 52e, 55e, and 58e are opened, the valves 52e, 55e, and 58e are closed and the valve 54e is opened. Thus, the supply of the purge gas into the processing container 1 is stopped, and the SiH$_4$ gas stored in the storage tank 54d is supplied into the processing container 1, so that Si is doped into the TiCl$_4$ gas adsorbed onto the surface of the wafer W (step S3). At this time, since the valves 52e, 55e, and 58e are closed, the purge gas supplied from the N$_2$ gas sources 52a, 55a, and 58a to the gas supply lines 52b, 55b, and 58b, respectively, is stored in the storage tanks 52d, 55d, and 58d. Therefore, the pressure inside the storage tanks 52d, 55d, and 58d are boosted.

After a predetermined time (e.g., 0.05 to 5 seconds) elapses after the valve 54e is opened, the valve 54e is closed and the valves 52e, 55e, and 58e are opened. Thus, the supply of the SiH$_4$ gas into the processing container 1 is stopped, and the purge gas stored in each of the storage tanks 52d, 55d, and 58d is supplied into the processing container 1 (step S4). At this time, since the purge gas is supplied from the storage tanks 52d, 55d, and 58d in the pressure-boosted state, the purge gas is supplied into the processing container 1 at a relatively large flow rate (e.g., a flow rate larger than the flow rate of the carrier gas). Therefore, the SiH$_4$ gas remaining in the processing container 1 is quickly discharged to the exhaust pipe 41, and the interior of the processing container 1 is replaced from a SiH$_4$ gas atmosphere to a N$_2$ gas atmosphere in a short time. In addition, by closing the valve 54e, the SiH$_4$ gas supplied from the Si-containing gas source Ma to the gas supply line 54b is stored in the storage tank 54d, and the pressure inside the storage tank 54d is boosted.

By performing a cycle including steps S1 to S4 one or more times, a Si-doped Ti film is formed on the wafer W.

Subsequently, the valve 57e is opened, and the NH$_3$ gas stored in the storage tank 57d is supplied into the processing container 1 and adsorbed onto the Si-doped Ti film to nitride the Si-doped Ti film (step S5). At this time, since the valves 52e, 55e, and 58e are closed, the purge gas supplied from the N$_2$ gas sources 52a, 55a, and 58a to the gas supply lines 52b, 55b, and 58b, respectively, is stored in the storage tanks 52d, 55d, and 58d. Thus, the pressures inside the storage tanks 52d, 55d, and 58d are boosted.

After a predetermined time (e.g., 0.01 to 5 seconds) elapses after the valve 57e is opened, the valve 57e is closed and the valves 52e, 55e, and 58e are opened. Thus, the supply of the NH$_3$ gas into the processing container 1 is stopped, and the purge gas stored in each of the storage tanks 52d, 55d, and 58d is supplied into the processing container 1 (step S6). At this time, since the purge gas is supplied from the storage tanks 52d, 55d, and 58d in the pressure-boosted state, the purge gas is supplied into the processing container 1 at a relatively large flow rate (e.g., a flow rate larger than the flow rate of the carrier gas). Therefore, the NH$_3$ gas remaining in the processing container 1 is quickly discharged to the exhaust pipe 41, and the interior of the processing container 1 is replaced from a NH$_3$ gas atmosphere to a N$_2$ gas atmosphere in a short time. In addition, by closing the valve 57e, the NH$_3$ gas supplied from the nitrogen-containing gas source 57a to the gas supply line 57b is stored in the storage tank 57d, and the pressure inside the storage tank 57d is boosted.

By performing a cycle including steps S1 to S6 once, a thin TiSiN unit film is formed. Then, the cycle including steps S1 to S6 is repeated a set number of times m (step S7). By repeating the cycle including steps S1 to S6 until the set number of times m is reached, Si having a predetermined film thickness is doped, and a TiSiN film having desired film characteristics is formed on the wafer.

Thereafter, the wafer W is unloaded from the processing container 1 in the reverse procedure to that at the time of loading the wafer W into the processing container 1.

In the above-described example, a case in which the purge gas (N$_2$ gas) stored in the storage tanks 52d, 55d, and 58d is supplied into the processing container 1 to purge the interior of the processing container 1 in steps S2, S4, and S6 have been described, but the present disclosure is not limited thereto. For example, the interior of the processing container 1 may be purged by the carrier gas (N$_2$ gas) supplied from the N$_2$ gas sources 53a, 56a, and 59a into the processing container 1 without supplying the purge gas (N$_2$ gas) stored in the storage tanks 52d, 55d, and 58d into the processing container 1.

In the film forming method according to the present embodiment, there may be a case in which the cycle including steps S1 to S4 is performed once and a case in which the cycle including steps S1 to S4 is performed multiple times. In either case, a Si-doped Ti film is formed on the wafer W. In addition, in the film forming method according to the present embodiment, when the cycle including steps S1 to S4 is performed once, the time from opening the valve 51e to closing the valve 51e may be shorter than other processing times (the SiH$_4$ gas supply time, the NH$_3$ gas supply time, and the purging time). When the cycle including steps S1 to S4 is performed multiple times, the time from opening the valve 51e to closing the valve 51e may be equal to or approximate to other processing times (the SiH$_4$ gas supply time, the NH$_3$ gas supply time, and the purging time).

(Evaluation)

Next, a TiSiN film was formed using the film forming apparatus illustrated in FIG. 2 by the film forming method described with reference to FIG. 1, and the characteristics of the TiSiN film (deposition rate, resistivity, resistivity improvement rate) were evaluated.

The process condition is as follows.

Film-forming temperature: 400 to 530 degrees C.

Flow rate of SiH4 gas: 10 to 500 sccm

Flow time of SiH4 gas: 0.05 to 1 seconds

In addition, the set number of times m in the film forming method according to the present embodiment was set to one. In the film forming method of the present embodiment (multiple cycles), the set number of times n was set to three. The set number of times n in the film forming method of the present embodiment (one cycle) was set to one.

In addition, a TiN film was formed as a comparative example. In the film forming method of the comparative example, a TiCl$_4$ gas was supplied to form a Ti layer, then the supply of TiCl4 gas was stopped, and the interior of the processing container was purged with a purge gas. Then, a NH$_3$ gas was supplied into the processing container. Thus, the Ti layer was nitrided to form a TiN layer. Subsequently, after stopping the supply of the NH$_3$ gas, the interior of the processing container was purged with a purge gas. In addition, the number of times of repeating the film forming method (supplying $TiCl_4$ gas→purging→supplying $NH_3$ gas→purging) of the above-described comparative example was set to one.

Figure 3:
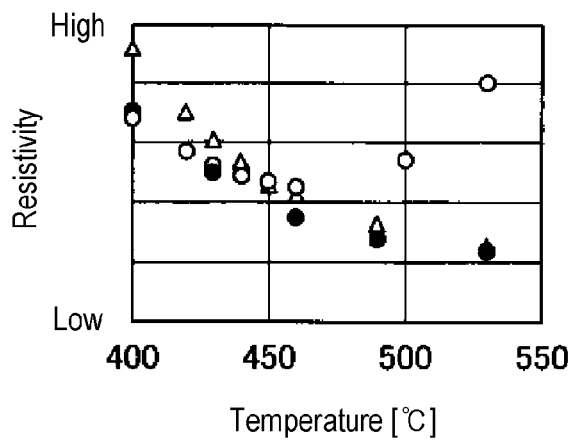
FIG. 3 is a view showing an example of resistivities of films formed by a film forming method according to an embodiment.
Figure 4:
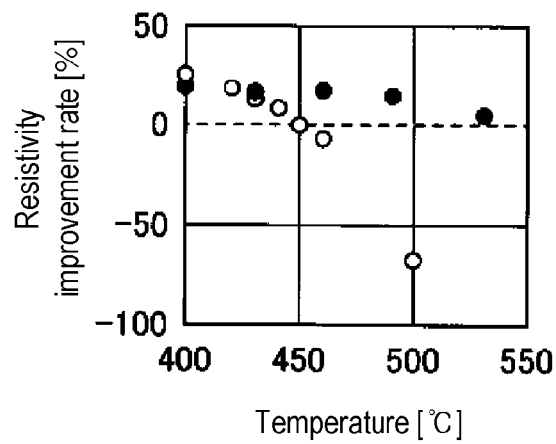
FIG. 4 is a view showing an example of resistivity improvement rates of films formed by a film forming method according to an embodiment.

FIG. 3 is a view showing an example of resistivities of films formed by a film forming method according to an embodiment in comparison with a comparative example. FIG. 4 is a view showing an example of resistivity improvement rates of films formed by a film forming method according to an embodiment. FIG. 5 is a view showing an example of film-forming rates obtained by a film forming method according to an embodiment in comparison with a comparative example. The horizontal axes of FIGS. 3 to 5 represent a substrate temperature (a temperature of a wafer W). The vertical axis in FIG. 3 represents a resistivity of a film, the vertical axis in FIG. 4 represents a resistivity improvement rate of a film, and the vertical axis in FIG. 5 represents a film formation rate. In addition, in FIGS. 3 to 5, "Δ" indicates results for TiN films formed by the film forming method of the comparative example, "○" indicates results for TiSiN films formed by the film forming method of the "present embodiment (one cycle)", and "●" indicates results for TiSiN films formed by the film forming method of the "present embodiment (multiple cycles)".

A resistivity improvement rate is obtained by $((Rv2-Rv1)/Rv2)\times 100$, where $Rv1$ is the resistivity of each of TiSiN films formed by the film forming method of the "present embodiment (one cycle)" and by the film forming method of the "present embodiment (multiple cycles)," and $Rv2$ is the resistivity of each TiN films of the comparative example. The same symbols in FIGS. 3 to 5 show results for films formed by the same film forming methods.

First, the resistivity of each of the films shown in FIG. 3 will be considered. It was found that when a reference temperature of the substrate temperature was set to 400 degrees C., each of the TiSiN films formed by the "present embodiment (one cycle)" indicated by "○" in FIG. 3 and by the "present embodiment (multiple cycles)" indicated by "●" in FIG. 3 had resistivities lower than those of the TiN films formed by the film forming method according to the comparative example indicated by "Δ" in FIG. 3. In particular, the TiSiN films formed by the film forming method according to the present embodiment (multiple cycles) had lower resistance values at a substrate temperature of 400 degrees C. to 530 degrees C. compared to those formed by the film forming method of the comparative example. Also, the TiSiN films formed by the film forming method according to the present embodiment (one cycle) had lower resistance values at a substrate temperature of 400 degrees C. to 430 degrees C. compared to those formed by the film forming method of the comparative example.

The reason is that in the film forming method according to the present embodiment, it is possible to cause the $TiCl_4$ gas and the $SiH_4$ gas to sufficiently react with each other by repeating steps S1 to S4 of FIG. 1 n times (n≥1). In particular, in the film forming method according to the present embodiment (multiple cycles), it was possible to cause the $TiCl_4$ gas and the $SiH_4$ gas to sufficiently react with each other by repeating steps S1 to S4 multiple times.

As described above, in the film forming method according to the embodiment (multiple cycles), even when the substrate temperature becomes 430 degrees C. or higher, the $TiCl_4$ gas and the $SiH_4$ gas sufficiently react with each other to produce $SiCl_4$. Thus produced $SiCl_4$ volatilizes and is discharged from the processing container without entering the TiSiN film. From the foregoing, it can be said that ratios of Si in the TiSiN films formed by the film forming method according to the present embodiment are lower than ratios of Si in the TiSiN films according to the comparative example, and the resistivities are lowered.

All of the TiSiN films formed at the temperatures of 400 degrees C. to 430 degrees C. by the film forming method of the present embodiment (one cycle) and by the film forming method of the present embodiment (multiple cycles) were the same in terms of the resistivity improvement rates of FIG. 4. In addition, the resistivity improvement rates of the TiSiN films formed by the film forming method of the present embodiment (multiple cycles) at the substrate temperatures of 430 degrees C. to 530 degrees C. were higher than those in the case of the present embodiment (one cycle).

Next, film formation rates shown in FIG. 5 will be considered. It was found that TiSiN films formed by the film forming method of the present embodiment (one cycle) and by the film forming method of the present embodiment (multiple cycles) had higher film-forming rates higher than those of TiN films formed by the comparative example at the substrate temperature of 400 degrees C. to 530 degrees C.

From the foregoing, the film forming method according to the present embodiment is capable of forming a low resistance film having a low temperature dependency. Thus, it is possible to produce a metal-containing nitride film containing silicon, which has excellent film characteristics. Further, the film forming method according to the present embodiment is capable of increasing a film-forming rate. Thus, it is possible to improve productivity.

As the gas supplied in step S3 of FIG. 1, a $SiH_4$ gas may be used among silicon-containing gases. However, the present disclosure is not limited thereto, and a DCS gas may be used. However, when the DCS gas is used, a Si concentration in a film increases when a flow rate of the DCS gas is the same as that of the $SiH_4$ gas, whereby a film resistivity also increases. In other words, when the $SiH_4$ gas is used, the Si concentration in the film decreases when the flow rate of the $SiH_4$ gas is the same as that of the DCS gas, and thus it is possible to reduce the film resistivity. Therefore, it is preferable to use the $SiH_4$ gas rather than the DCS gas. In addition, the advantageous effect increases as the supply time of the $SiH_4$ gas in step S3 of FIG. 1 increases.

In the film forming method according to the present embodiment, the supply time of the $TiCl_4$ gas supplied in step S1 of FIG. 1 may be equal to or less than the supply time of the $SiH_4$ gas supplied in step S3. In addition, in the film forming method according to the present embodiment, the supply time of the $TiCl_4$ gas supplied in step S1 of FIG. 1 may be equal to or approximate to the supply time of the $SiH_4$ gas supplied in step S3.

As described above, according to the film forming method of the present embodiment, at a substrate temperature of 400 degrees C. to 530 degrees C., it is possible to form a metal-containing nitride film containing silicon, which has desired film characteristics, regardless of the substrate temperature.

According to the present disclosure, it is possible to form a metal-containing nitride film containing silicon, which has desired film characteristics.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a metal-containing nitride film containing silicon, the method comprising:
adjusting a temperature of a substrate to a predetermined temperature of 400 degrees C. to 530 degrees C.;
forming a TiSi layer on the substrate by reacting chlorine and silicon to produce $SiCl_4$ and removing the chlorine and the silicon from the substrate by repeating a cycle, the cycle including: alternately supplying a $TiCl_4$ gas and a silicon-containing gas into a processing container in which the substrate is accommodated; and
forming a TiSiN film on the substrate by nitriding the TiSi layer on the substrate by supplying a nitrogen-containing gas to the TiSi layer on the substrate,
wherein a series of processes, in which the cycle is repeated n times and then the supplying the nitrogen-containing gas is executed, is repeated m times in this order (where m is an integer of one or more), and
wherein in the series of processes, if the temperature of the substrate is adjusted to a temperature range of 400 degrees C. or more and less than 430 degrees C., n is set to an integer of 1 or more, and if the temperature of the substrate is adjusted to a temperature range of 430 degrees C. or more and 530 degrees C. or less, n is set to an integer of two or more.

2. The method of claim 1, wherein an execution time of the supplying the $TiCl_4$ gas is equal to or approximate to an execution time of the supplying the silicon-containing gas.

3. The method of claim 2, wherein the silicon-containing gas is at least a gas selected from a group consisting of silane ($SiH_4$), disilane ($Si_2H_6$), chlorosilane ($ClH_3Si$), and dichlorosilane (DCS: $SiH_2Cl_2$).

4. The method of claim 3, wherein the nitrogen-containing gas is at least a gas selected from a group consisting of ammonia ($NH_3$), hydrazine ($N_2H_4$), and monomethylhydrazine (MMH).

5. The method of claim 4, further comprising purging the processing container between the supplying the $TiCl_4$ gas and the supplying the silicon-containing gas, between the supplying the silicon-containing gas and the supplying the nitrogen-containing gas, and between the supplying the nitrogen-containing gas and the supplying the $TiCl_4$ gas.

6. The method of claim 5, wherein the metal-containing nitride film containing silicon is a TiSiN film.

7. The method of claim 1, wherein the silicon-containing gas is at least a gas selected from a group consisting of silane ($SiH_4$), disilane ($Si_2H_6$), chlorosilane ($ClH_3Si$), and dichlorosilane (DCS: $SiH_2Cl_2$).

8. The method of claim 1, wherein the nitrogen-containing gas is at least a gas selected from a group consisting of ammonia ($NH_3$), hydrazine ($N_2H_4$), and monomethylhydrazine (MMH).

9. The method of claim 1, further comprising purging the processing container between the supplying the $TiCl_4$ gas and the supplying the silicon-containing gas, between the supplying the silicon-containing gas and the supplying the nitrogen-containing gas, and between the supplying the nitrogen-containing gas and the supplying the $TiCl_4$ gas.

10. The method of claim 1, wherein the metal-containing nitride film containing silicon is a TiSiN film.

* * * * *